US012592336B2

(12) United States Patent
Lim et al.

(10) Patent No.: US 12,592,336 B2
(45) Date of Patent: Mar. 31, 2026

(54) LAMINATED COMMON MODE FILTER

(71) Applicant: AMOTECH CO., LTD., Incheon (KR)

(72) Inventors: Byungguk Lim, Incheon (KR);
Heehwang Kim, Incheon (KR)

(73) Assignee: AMOTECH CO., LTD., Incheon (KR)

( * ) Notice: Subject to any disclaimer, the term of this
patent is extended or adjusted under 35
U.S.C. 154(b) by 142 days.

(21) Appl. No.: 18/707,580

(22) PCT Filed: Nov. 2, 2022

(86) PCT No.: PCT/KR2022/016963
§ 371 (c)(1),
(2) Date: May 4, 2024

(87) PCT Pub. No.: WO2023/080607
PCT Pub. Date: May 11, 2023

(65) Prior Publication Data
US 2025/0022647 A1      Jan. 16, 2025

(30) Foreign Application Priority Data

Nov. 5, 2021    (KR) ........................ 10-2021-0151206

(51) Int. Cl.
*H01F 27/28* (2006.01)
*H01F 27/29* (2006.01)
*H03H 7/01* (2006.01)

(52) U.S. Cl.
CPC ....... *H01F 27/2804* (2013.01); *H01F 27/292*
(2013.01); *H03H 7/0138* (2013.01); *H01F*
*2027/2809* (2013.01)

(58) Field of Classification Search
CPC .. H01F 27/34; H01F 17/0013; H01F 27/2804;
H01F 27/292; H01F 27/00;
(Continued)

(56) References Cited

U.S. PATENT DOCUMENTS 10,937,584 B2 * 3/2021 Kawashima ........ H01F 17/0013
2014/0347773 A1 * 11/2014 Park ...................... H02H 9/005
333/181
(Continued)

FOREIGN PATENT DOCUMENTS

JP        2002329611 A  *  11/2002
JP        2012160810 A  *   8/2012
(Continued)

OTHER PUBLICATIONS

KR Office Action dated Apr. 12, 2024 as received in Application No.
10-2021-0151206.

*Primary Examiner* — Quan Tra
(74) *Attorney, Agent, or Firm* — Maschoff Brennan

(57) ABSTRACT
Proposed is a laminated common mode filter in which a
ground pattern is interposed between coil patterns to form
additional capacitance. The proposed laminated common
mode filter comprises: an upper electrode layer composed of
a laminate having a first coil pattern, a second coil pattern,
and a third coil pattern; a ground layer that is arranged on the
lower portion of the upper electrode layer and has a ground
pattern; and a lower electrode layer that is arranged on the
lower portion of the ground layer and is composed of a
laminate having a fourth coil pattern, a fifth coil pattern, and
a sixth coil pattern, wherein the ground pattern is arranged
to overlap the coil patterns of the upper electrode layer and
the coil patterns of the lower electrode layer to form capaci-
tance.

12 Claims, 9 Drawing Sheets

(58) Field of Classification Search
　　　　CPC .. H01F 27/28; H01F 17/00; H01F 2027/2809;
　　　　　　　　　H01F 2017/0093; H03H 9/46; H03H
　　　　　　　　　7/427; H03H 7/0138; H03H 2001/0085
　　　　See application file for complete search history.

(56) References Cited

U.S. PATENT DOCUMENTS

| | | | | |
|---|---|---|---|---|
| 2016/0372254 A1 | 12/2016 | Harada et al. | | |
| 2017/0365402 A1 * | 12/2017 | Fukushima | ......... | H01F 27/2804 |
| 2019/0122801 A1 | 4/2019 | Kim et al. | | |
| 2021/0151241 A1 | 5/2021 | Toujo | | |

FOREIGN PATENT DOCUMENTS

| | | | | |
|---|---|---|---|---|
| JP | 2014175825 | A | * | 9/2014 |
| JP | 5961813 | B2 | * | 8/2016 |
| KR | 10-2010-0043518 | A | | 4/2010 |
| KR | 10-1197393 | B1 | | 11/2012 |
| KR | 10-2016-0057914 | A | | 5/2016 |
| KR | 10-2016-0138526 | A | | 12/2016 |
| KR | 10-2017-0128961 | A | | 11/2017 |
| KR | 10-2021-0043382 | A | | 4/2021 |

* cited by examiner

[FIG. 1]
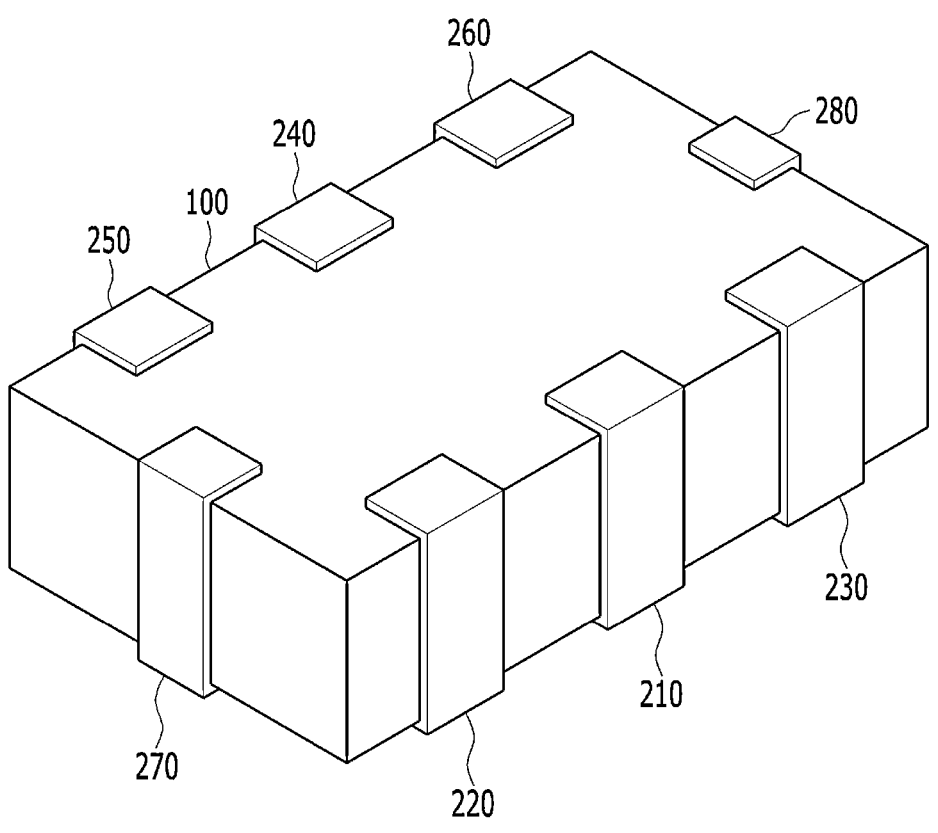

[FIG. 2]
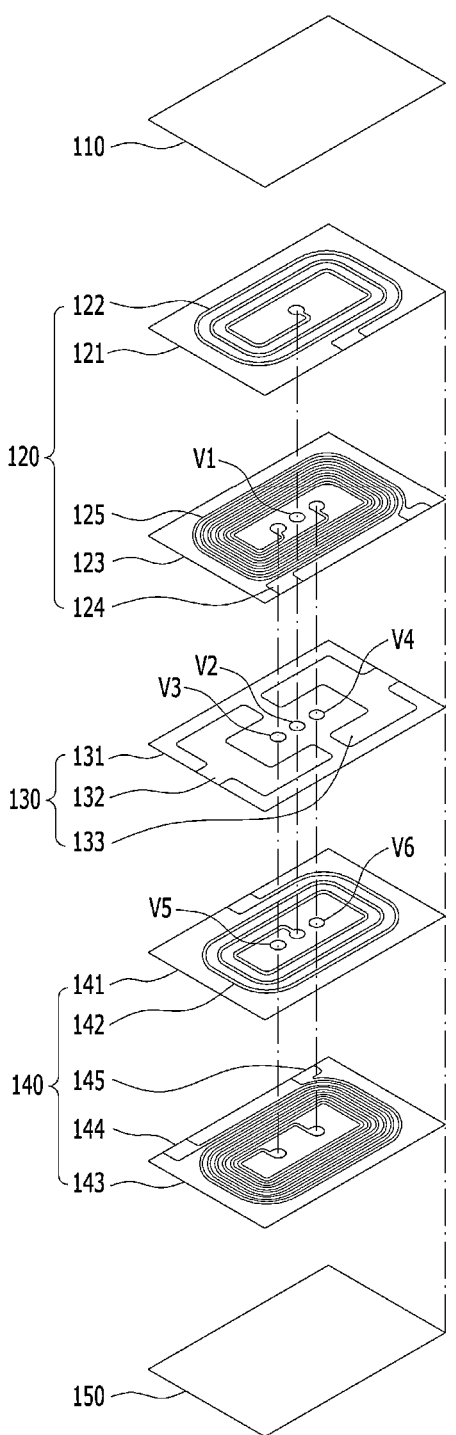

[FIG. 3]
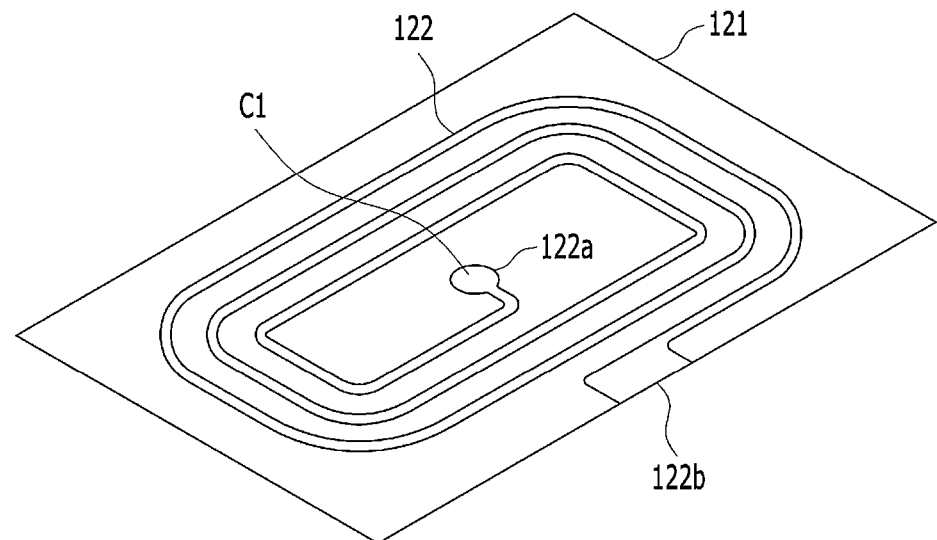
[FIG. 4]
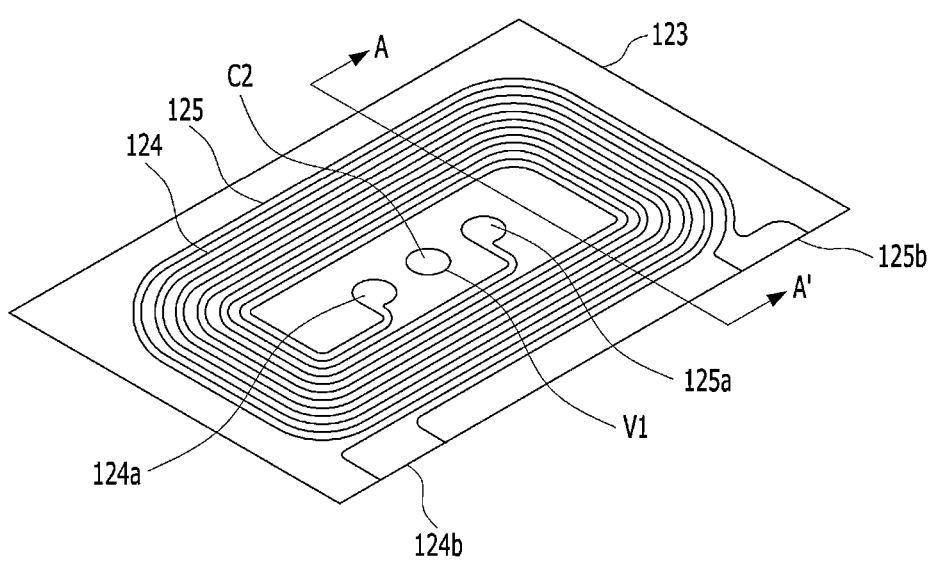

[FIG. 5]
[FIG. 6]
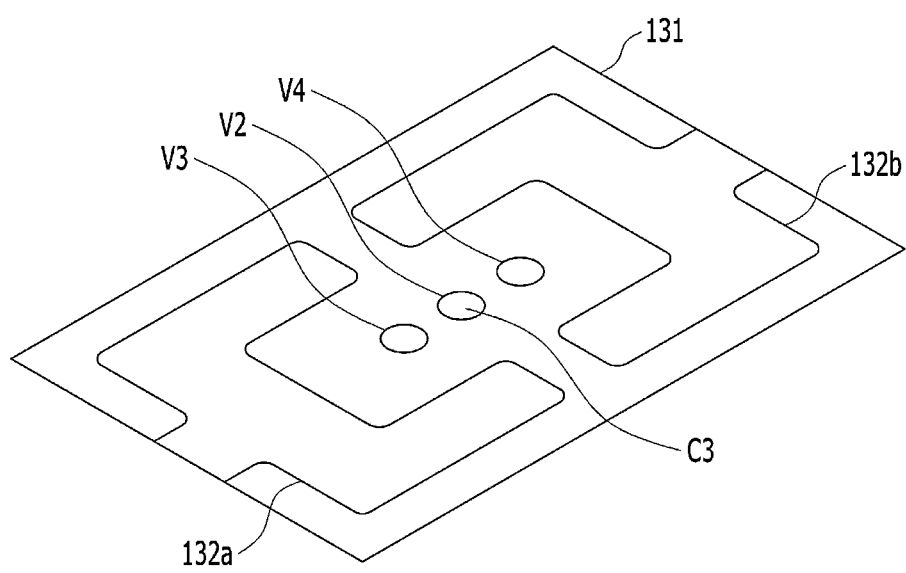

[FIG. 7]
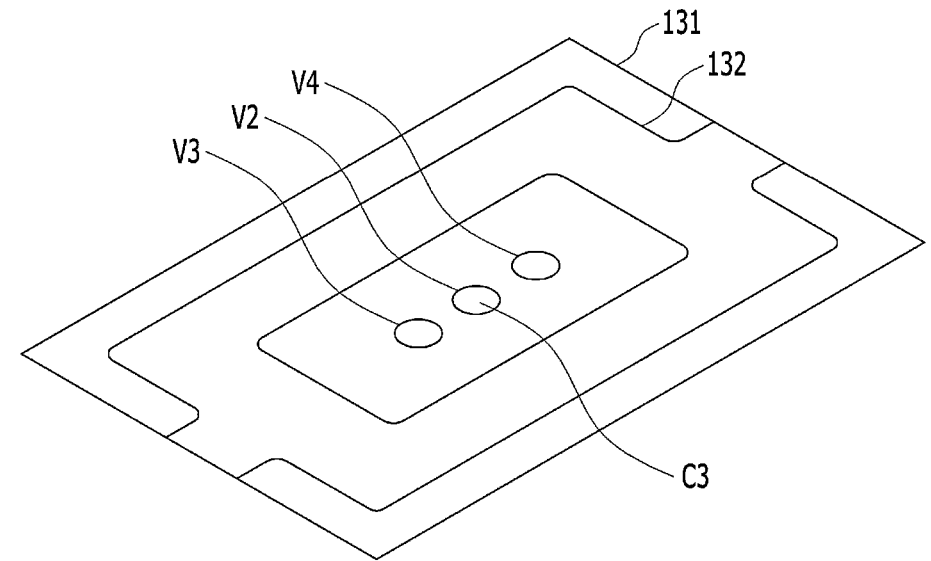
[FIG. 8]
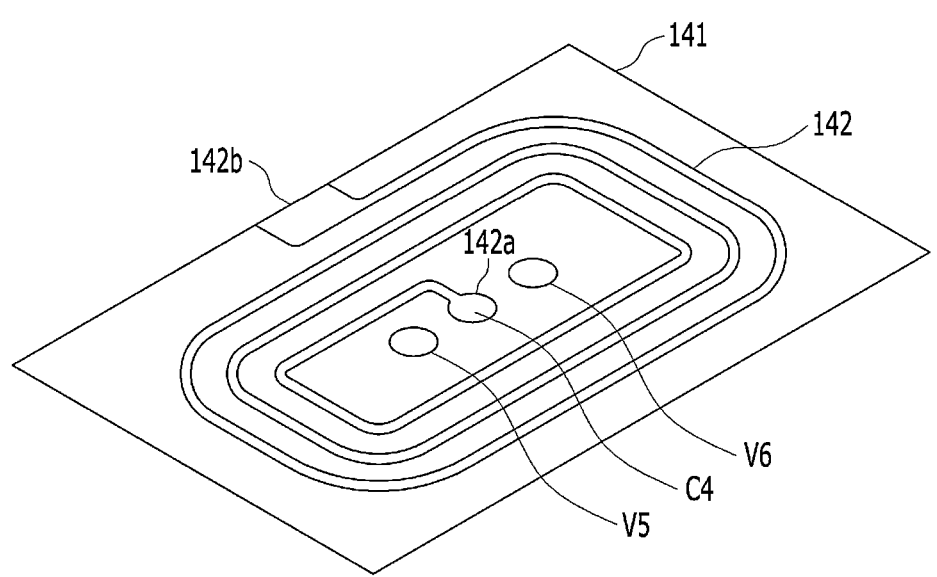

[FIG. 9]
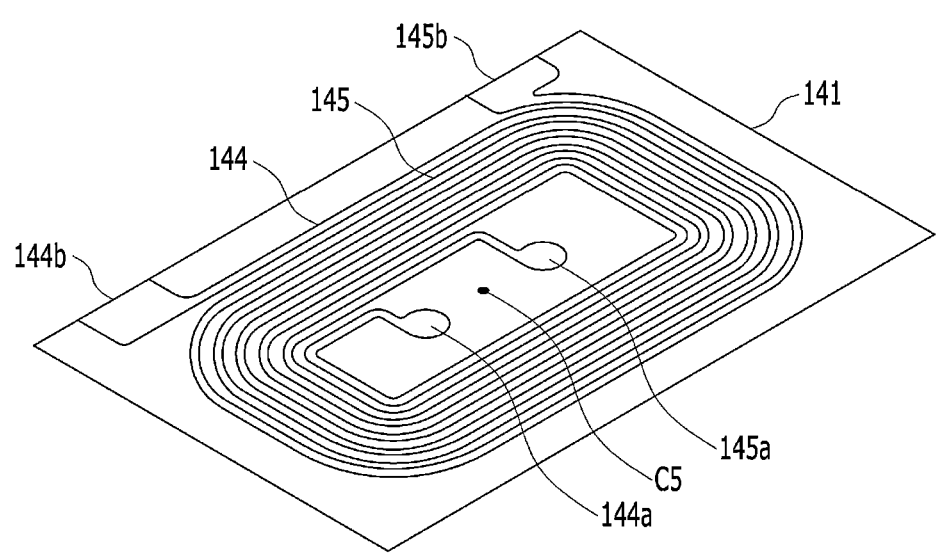

[FIG. 10]
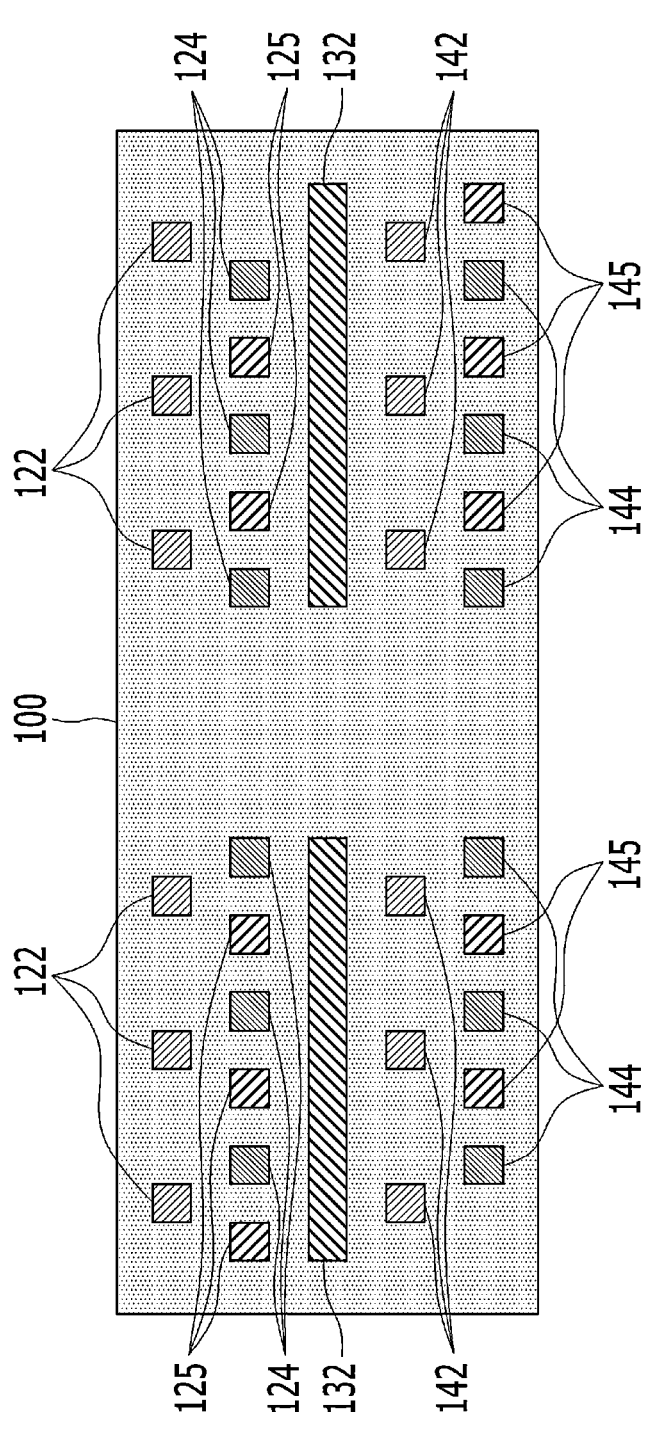

[FIG. 11]
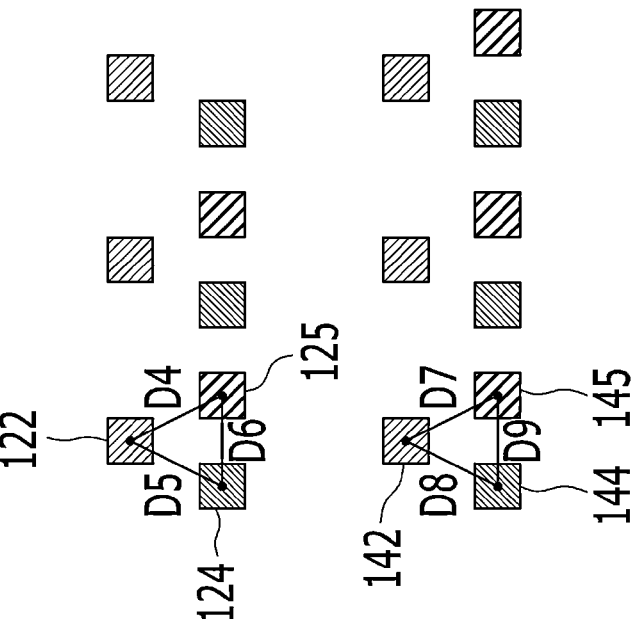
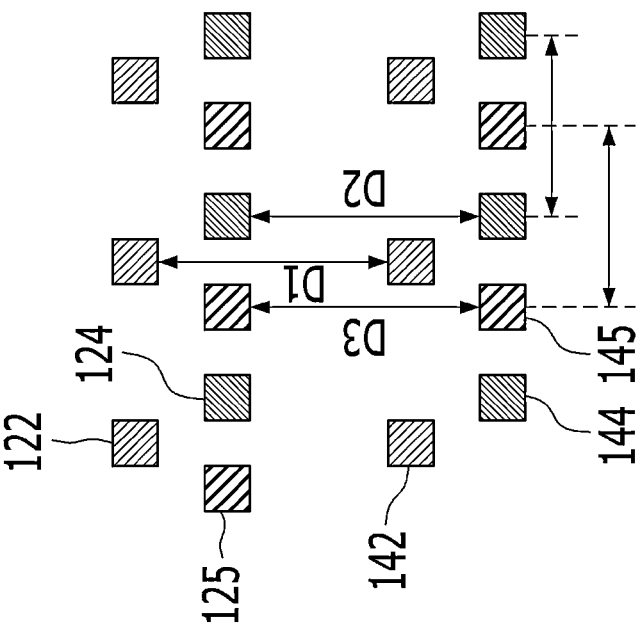

[FIG. 12]
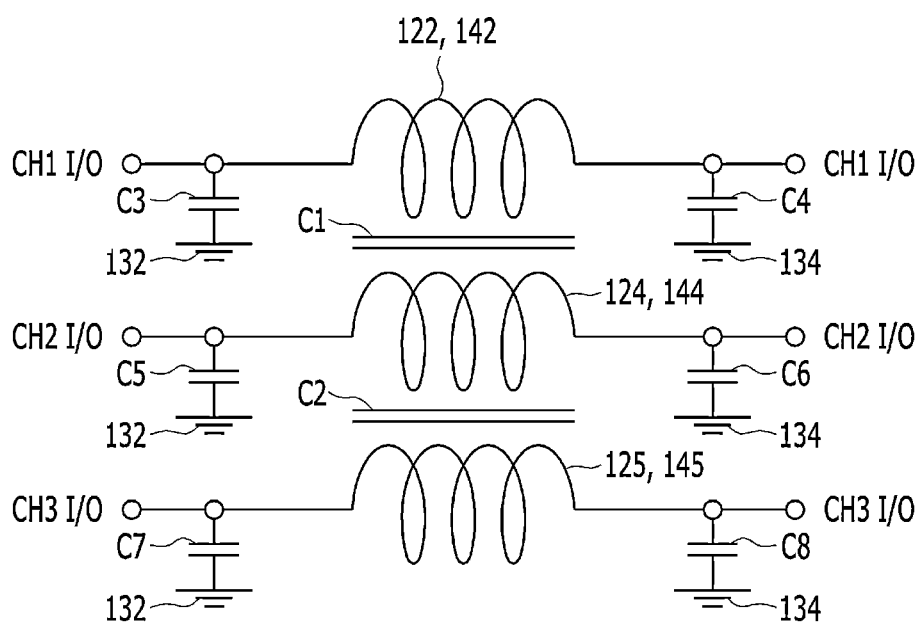

LAMINATED COMMON MODE FILTER

TECHNICAL FIELD

The present disclosure relates to a laminated common mode filter which transmits the current of a signal in a differential mode and removes noise current in a common mode in an electronic device to which a high speed signal line has been applied.

BACKGROUND ART

In general, a mobile industry processor interface (MIPI D-PHY) standard is adopted for a mobile terminal as a digital data transmission standard. The MIPI D-PHY standard is a digital data transmission standard in which a main circuit of a mobile terminal and a display or a camera are connected, and is a method of transmitting data as a differential signal using two transmission lines.

As data that are transmitted and received within the mobile terminal are suddenly increased, the mobile terminal requires a transmission method capable of transmitting and receiving data at high speed compared to the MIPI D-PHY.

Accordingly, in the mobile terminal industry, research for applying an MIPI C-PHY standard to the mobile terminal is recently carried out. The MIPI C-PHY standard is a method of transmitting different voltages from the transmission side to three transmission lines, respectively, by using the three transmission lines and differentially outputting differences between the lines by taking the differences on the reception side.

The contents described in the Background Art are to help the understanding of the background of the disclosure, and may include contents that are not a disclosed conventional technology.

DISCLOSURE

Technical Problem

The present disclosure has been proposed by considering the aforementioned circumstances, and an object of the present disclosure is to provide a laminated common mode filter in which additional capacitance has been formed by interposing a ground pattern between coil patterns.

Technical Solution

In order to achieve the object, a laminated common mode filter according to an embodiment of the present disclosure includes an upper electrode layer constructed as a stack body in which a first coil pattern, a second coil pattern, and a third coil pattern have been formed, a ground layer disposed under the upper electrode layer and having a ground pattern formed thereon, and a lower electrode layer constructed as a stack body in which a fourth coil pattern, a fifth coil pattern, and a sixth coil pattern have been formed and disposed under the ground layer. The ground pattern is disposed to overlap the coil pattern of the upper electrode layer and the coil pattern of the lower electrode layer and configured to form capacitance.

The first coil pattern may be disposed in a layer different from a layer of the second coil pattern and the third coil pattern. The second coil pattern and the third coil pattern may be alternately disposed in an identical layer on the basis of a vertical section of the upper electrode layer.

The fourth coil pattern may be disposed in a layer different from a layer of the fifth coil pattern and the sixth coil pattern. The fifth coil pattern and the sixth coil pattern may be alternately disposed in an identical layer on the basis of a vertical section of the lower electrode layer.

The first coil pattern and the fourth coil pattern may be connected through a via hole and construct a first coil, and may be disposed to overlap each other with the ground pattern interposed therebetween. The second coil pattern and the fifth coil pattern may be connected through a via hole and construct a second coil, and may be disposed to overlap each other with the ground pattern interposed therebetween. The third coil pattern and the sixth coil pattern may be connected through a via hole and constructs a third coil, and may be disposed to overlap each other with the ground pattern interposed therebetween. The first coil pattern to the sixth coil pattern may be configured to form additional capacitance by overlapping with the ground pattern.

The upper electrode layer, the ground layer, and the lower electrode layer may be stacked to construct a stack body. Ends of the first coil pattern, the second coil pattern, and the third coil pattern may be exposed to a first lateral surface of the stack body. Ends of the fourth coil pattern, the fifth coil pattern, and the sixth coil pattern may be exposed to a second lateral surface of the stack body, which faces the first lateral surface of the stack body. A first end of the ground pattern may be exposed to a third lateral surface of the stack body. A second end of the ground pattern may be exposed to a fourth lateral surface of the stack body, which faces the third lateral surface of the stack body.

The laminated common mode filter according to an embodiment of the present disclosure may further include a plurality of external electrodes disposed on a lateral surface of the stack body and connected to one pattern, among the first coil pattern to the sixth coil pattern that are exposed to the lateral surface of the stack body and the ground pattern, in a one-to-one way.

In order to achieve the object, a laminated common mode filter according to another embodiment of the present disclosure may include a first sheet, a first coil pattern disposed on a first surface of the first sheet, a second sheet disposed on a lower surface of the first sheet, a second coil pattern disposed on a first surface of the second sheet and interposed between the first sheet and the second sheet, a third coil pattern disposed on the first surface of the second sheet, interposed between the first sheet and the second sheet, and spaced apart from the second coil pattern, a third sheet disposed on a lower surface of the second sheet, a ground pattern disposed on a first surface of the third sheet, interposed between the second sheet and the third sheet, and disposed to overlap the first coil pattern, the second coil pattern, and the third coil pattern, a fourth sheet disposed on a lower surface of the third sheet, a fourth coil pattern disposed on a first surface of the fourth sheet, interposed between the third sheet and the fourth sheet, configured to construct a first coil by being connected to the first coil pattern through a via hole, and disposed to overlap the first coil pattern and the ground pattern, a fifth sheet disposed on a lower surface of the fourth sheet, a fifth coil pattern disposed on a first surface of the fifth sheet, interposed between the fourth sheet and the fifth sheet, configured to construct a second coil by being connected to the second coil pattern through a via hole, and disposed to overlap the second coil pattern and the ground pattern, and a sixth coil pattern disposed to be spaced apart from the fifth coil pattern on the first surface of the fifth sheet, interposed between the fourth sheet and the fifth sheet, configured to construct a third coil by being connected to the third coil pattern through a via hole, and disposed to overlap the third coil pattern and the ground pattern.

The second coil pattern and the second coil pattern may be alternately disposed on the basis of a vertical section of the second sheet. The fifth coil pattern and the sixth coil pattern may be alternately disposed on the basis of a vertical section of the fifth sheet.

The ground pattern may include a first ground pattern disposed to overlap some of the first coil pattern to the sixth coil pattern and configured to form additional capacitance and a second ground pattern spaced apart from the first ground pattern, disposed to overlap other some of the first coil pattern to the sixth coil pattern, and configured to form additional capacitance.

Ends of the first coil pattern, the second coil pattern, and the third coil pattern may be exposed to a first lateral surface of a stack body in which the first sheet to the fifth sheet have been stacked. Ends of the fourth coil pattern, the fifth coil pattern, and the sixth coil pattern may be exposed to a second lateral surface of the stack body, which faces the first lateral surface of the stack body.

The laminated common mode filter according to an embodiment of the present disclosure may further include a first external electrode disposed on the first lateral surface of the stack body and connected to the first coil pattern, a second external electrode disposed on the first lateral surface of the stack body and connected to the second coil pattern, a third external electrode disposed on the first lateral surface of the stack body and connected to the third coil pattern, a fourth external electrode disposed on the second lateral surface of the stack body and connected to the fourth coil pattern, a fifth external electrode disposed on the second lateral surface of the stack body and connected to the fifth coil pattern, and a sixth external electrode disposed on the second lateral surface of the stack body and connected to the sixth coil pattern.

A first end of a ground pattern of a ground layer may be exposed to a third lateral surface of the stack body. A second end of the ground pattern may be exposed to a fourth lateral surface of the stack body, which faces the third lateral surface of the stack body. In this case, the laminated common mode filter according to an embodiment of the present disclosure may further include a seventh external electrode disposed on a third lateral surface of the stack body and connected to the first end of the ground pattern and an eighth external electrode disposed on a fourth lateral surface of the stack body and connected to the second end of the ground pattern.

Advantageous Effects

According to the present disclosure, the laminated common mode filter has an effect in that it can increase capacitance without adding an electrode layer composed of a sheet layer in which a coil pattern has been formed because additional capacitance C3 to C8 is formed between respective coils and the ground pattern by interposing the ground pattern between the coil patterns.

Furthermore, the laminated common mode filter can expand an attenuation band by forming an additional notch in a common mode attenuation characteristic because the additional capacitance is formed between the coil and the ground pattern.

DESCRIPTION OF DRAWINGS

FIG. 1 is a perspective view of a laminated common mode filter according to an embodiment of the present disclosure.

FIG. 2 is an exploded perspective view of the laminated common mode filter according to an embodiment of the present disclosure.

FIG. 3 is a diagram for describing a first sheet of an upper electrode layer in FIG. 2.

FIGS. 4 and 5 are diagrams for describing a second sheet of the upper electrode layer in FIG. 2.

FIGS. 6 and 7 are diagrams for describing a ground layer in FIG. 2.

FIG. 8 is a diagram for describing a fourth sheet of a lower electrode layer in FIG. 2.

FIG. 9 is a diagram for describing a fifth sheet of the lower electrode layer in FIG. 2.

FIG. 10 is a vertical cross-sectional view for describing a positional relation between coil patterns of the laminated common mode filter according to an embodiment of the present disclosure.

FIG. 11 is a diagram for describing a positional relation between coil patterns of the laminated common mode filter according to an embodiment of the present disclosure.

FIG. 12 is a diagram illustrating an equivalent circuit of the laminated common mode filter according to an embodiment of the present disclosure.

MODE FOR INVENTION

Hereinafter, preferred embodiments of the present disclosure are described in detail with reference to the accompanying drawings.

Embodiments are provided to more fully explain the present disclosure to a person having ordinary knowledge in the art to which the present disclosure pertains. The following embodiments may be modified in various other forms, and the scope of the present disclosure is not limited to the following embodiments. Rather, these embodiments are provided to make the present disclosure more thorough and complete and to fully convey the spirit of the present disclosure.

Terms used in this specification are used to describe a specific embodiment, and are not intended to limit the present disclosure. Furthermore, in this specification, an expression of the singular number may include an expression of the plural number unless clearly defined otherwise in the context.

In the description of the embodiments, when it is described that each layer (film), area, pattern, or structure is formed "on" or "under" each substrate, layer (film), area, pad, or pattern, this includes both expressions, including that a layer is formed on another layer "directly" or "with a third layer interposed between the two layers (indirectly)". Furthermore, a criterion for the term "on or under of each layer" is described based on the drawings.

The drawings are merely for enabling the spirit of the present disclosure to be understood, and it should not be interpreted that the scope of the present disclosure is limited by the drawings. Furthermore, in the drawings, a relative thickness or length or a relative size may be enlarged for convenience and the clarity of description.

Referring to FIG. 1, a laminated common mode filter according to an embodiment of the present disclosure is constructed to include a filter stack body 100, a first external electrode 210, a second external electrode 220, a third external electrode 230, a fourth external electrode 240, a fifth external electrode 250, a sixth external electrode 260, a seventh external electrode 270, and an eighth external electrode 280.

Referring to FIG. 2, the filter stack body 100 is a stack body in which an upper protection layer 110, an upper electrode layer 120, a ground layer 130, a lower electrode layer 140, and a lower protection layer 150 have been stacked.

The upper protection layer 110 is disposed at the top of the laminated common mode filter. That is, the upper protection layer 110 is disposed on the upper electrode layer 120 and disposed at the top of the laminated common mode filter. In this case, the upper protection layer 110 is constructed by stacking one or more dielectric sheets on the upper protection layer.

The upper electrode layer 120 is constructed as a stack body in which a plurality of coil patterns has been formed, and is disposed under the upper protection layer 110. The upper electrode layer 120 is constructed by stacking a plurality of sheets on each of which a coil pattern has been formed on the upper electrode layer. In this case, the coil patterns stacked on the sheet form a plurality of coils that construct a plurality of channels.

For example, the upper electrode layer 120 is constructed to include a first sheet 121 and a second sheet 123. Coil patterns are formed in the first sheet 121 and the second sheet 123. The first sheet 121 is disposed on the second sheet 123.

Referring to FIG. 3, the first sheet 121 is disposed under the upper protection layer 110. A first coil pattern 122 that constructs a first channel is disposed on an upper surface of the first sheet 121.

A first end 122a of the first coil pattern 122 is disposed at a center point C1 of the first sheet 121. The first coil pattern 122 is disposed on the upper surface of the first sheet 121, and forms a first loop by winding the center point C1 of the first sheet 121 in plural times. A second end 122b of the first coil pattern 122 is disposed on the same line as a first side of the first sheet 121.

Referring to FIG. 4, the second sheet 123 is disposed under the first sheet 121. A second coil pattern 124 that constructs a second channel and a third coil pattern 125 that constructs a third channel are formed on an upper surface of the second sheet 123. In this case, a first via hole V1 connected to the first coil pattern 122 is formed at a center point C2 of the second sheet 123.

The second coil pattern 124 is disposed on the upper surface of the second sheet 123, and forms a second loop by winding the center point C2 of the second sheet 123 in plural times.

A first end 124a of the second coil pattern 124 is disposed to be spaced apart from the center point C2 of the second sheet 123 at a predetermined interval.

A second end 124b of the second coil pattern 124 is disposed on the same line as a first side of the second sheet 123. In this case, the second end 124b of the second coil pattern 124 is disposed to neighbor a second side that is orthogonal to the first side of the second sheet 123.

The third coil pattern 125 is disposed on the upper surface of the second sheet 123, and forms a third loop by winding the center point C2 of the second sheet 123 in plural times.

A first end 125a of the third coil pattern 125 is disposed to be spaced apart from the center point C2 of the second sheet 123 at a predetermined interval. In this case, the first end 125a of the third coil pattern 125 is disposed to face the first end 124a of the second coil pattern 124 with the center point C2 of the second sheet 123 interposed therebetween.

A second end 125b of the third coil pattern 125 is disposed on the same line as the first side of the second sheet 123. In this case, the second end 125b of the third coil pattern 125 is disposed to neighbor a third side that is orthogonal to the first side of the second sheet 123 and that faces the second side of the second sheet 123.

The third coil pattern 125 is disposed among the second loop in which the second coil pattern 124 has been formed. Accordingly, as illustrated in FIG. 5, in a cross section of the second sheet 123 that has been vertically cut on the basis of A-A', the second coil pattern 124 and the third coil pattern 125 are alternately disposed.

The ground layer 130 is interposed between the upper electrode layer 120 and the lower electrode layer 140. In this case, in FIG. 2, in order to easily describe an embodiment of the present disclosure, the ground layer 130 composed of one sheet has been described as an example, but the present disclosure is not limited thereto. The ground layer 130 may be constructed as a stack body in which two or more sheets have been stacked.

Referring to FIG. 6, the ground layer 130 is constructed to include a third sheet 131. A second via hole V2, a third via hole V3, a fourth via hole V4, a first ground pattern 132a, and a second ground pattern 132b may be formed in the third sheet 131.

The second via hole V2 is disposed at a center point C3 of the third sheet 131, and is connected to the first via hole V1 and the first coil pattern 122 of the first sheet 121. The second via hole V2 is connected to a coil pattern that forms the first channel along with the first coil pattern 122, among coil patterns that have been formed in the lower electrode layer 140 to be described later.

The third via hole V3 is disposed to be spaced apart from the center point C3 of the third sheet 131 at a predetermined interval. The third via hole V3 is connected to the second coil pattern 124 of the second sheet 123. The third via hole V3 is connected to a coil pattern that forms the second channel along with the second coil pattern 124, among coil patterns that have been formed in the lower electrode layer 140 to be described later.

The fourth via hole V4 is disposed to be spaced apart from the center point C3 of the third sheet 131 at a predetermined interval. The fourth via hole V4 is disposed to face the third via hole V3 with the center point C3 of the third sheet 131 interposed therebetween. The fourth via hole V4 is connected to the third coil pattern 125 of the second sheet 123. The fourth via hole V4 is connected to a coil pattern that forms the third channel along with the third coil pattern 125, among the coil patterns that have been formed in the lower electrode layer 140 to be described later.

The first ground pattern 132a is disposed to neighbor a second side of the third sheet 131. The first ground pattern 132a is constructed include a first pattern, a second pattern, a first extension pattern, and a second extension pattern.

The first pattern is formed in a plate form and disposed on an upper surface of the third sheet 131. A first end of the first pattern is disposed on the same line as the second side of the third sheet 131. A second end of the second pattern is connected to the second pattern.

The second pattern is formed in a plate form in which the second pattern is orthogonal to the first pattern, and is disposed on the upper surface of the third sheet 131. A first end of the second pattern is disposed to neighbor a first side of the third sheet 131. The second end of the second pattern is disposed to neighbor a fourth side of the third sheet 131 that faces the first side of the third sheet 131.

The first extension pattern is formed in a plate form, and is disposed to be extended from the first end of the second pattern toward a third side of the third sheet 131. In this case, the first extension pattern is formed in a rectangular form in which the first extension pattern has a long side and a short side. The short side neighbors the first side of the third sheet 131, and is disposed to be parallel to the first side of the third sheet 131.

A first end of the first extension pattern is connected to the first end of the second pattern. A second end of the first extension pattern is disposed to be spaced apart from the second ground pattern 132*b* at a predetermined interval while facing the second ground pattern 132*b*.

The second extension pattern is formed in a plate form, and is disposed to be extended from the second end of the second pattern toward the third side of the third sheet 131. In this case, the second extension pattern is formed in a rectangular form in which the second extension pattern has a long side and a short side. The short side neighbors the fourth side of the third sheet 131, and is disposed to be parallel to the fourth side of the third sheet 131.

A first end of the second extension pattern is connected to the second end of the second pattern. A second end of the second extension pattern is disposed to be spaced apart from the second ground pattern 132*b* at a predetermined interval while facing the second ground pattern 132*b*.

The second ground pattern 132*b* is disposed to neighbor the third side of the third sheet 131. The second ground pattern 132*b* is constructed to include a third pattern, a fourth pattern, a third extension pattern, and a fourth extension pattern.

The third pattern is formed in a plate form and disposed on the upper surface of the third sheet 131. A first end of the third pattern is disposed on the same line as the third side of the third sheet 131. A second end of the third pattern is connected to the fourth pattern.

The fourth pattern is formed in a plate form in which the fourth pattern is orthogonal to the third pattern, and is disposed on the upper surface of the third sheet 131. A first end of the fourth pattern is disposed to neighbor the first side of the third sheet 131. A second end of the fourth pattern is disposed to neighbor the fourth side of the third sheet 131, which faces the first side of the third sheet 131.

The third extension pattern is formed in a plate form, and is disposed to be extended from the first end of the fourth pattern toward the second side of the third sheet 131. In this case, the third extension pattern is formed in a rectangular form in which the third extension pattern has a long side and a short side. The short side neighbors the first side of the third sheet 131, and is disposed to be parallel to the first side of the third sheet 131.

A first end of the third extension pattern is connected to the first end of the fourth pattern. A second end of the third extension pattern is disposed to be spaced apart from the first extension pattern of the first ground pattern 132*a* at a predetermined interval while facing the first extension pattern of the first ground pattern 132*a*.

The fourth extension pattern is formed in a plate form, and is disposed to be extended from the second end of the fourth pattern toward the second side of the third sheet 131. In this case, the fourth extension pattern is formed in a rectangular form in which the fourth extension pattern has a long side and a short side. The short side neighbors the fourth side of the third sheet 131, and is disposed to be parallel to the fourth side of the third sheet 131.

A first end of the fourth extension pattern is connected to the second end of the fourth pattern. A second end of the fourth extension pattern is disposed to be spaced apart from the second extension pattern of the first ground pattern 132*a* at a predetermined interval while facing the second extension pattern of the first ground pattern 132*a*.

Referring to FIG. 7, the first ground pattern 132*a* and the second ground pattern 132*b* may be formed as a short structure in which the first ground pattern 132*a* and the second ground pattern 132*b* have been connected without being spaced apart from each other. That is, the first extension pattern of the first ground pattern 132*a* and the third extension pattern of the second ground pattern 132*b* are connected to construct one extension pattern. The second extension pattern of the first ground pattern 132*a* and the fourth extension pattern of the second ground pattern 132*b* are connected to construct the other extension pattern. Accordingly, one ground pattern 132 in which all of the first pattern to the fourth pattern and the first extension pattern to the fourth extension pattern have been connected may be formed in the ground layer 130.

The lower electrode layer 140 is a stack body in which a plurality of coils has been formed. The lower electrode layer 140 is constructed by stacking a plurality of sheets in which coil patterns have been formed. In this case, the coil patterns stacked on the sheets form a plurality of coils that construct a plurality of channels.

For example, the lower electrode layer 140 is constructed to include a fourth sheet 141 and a fifth sheet 143.

Referring to FIG. 8, the fourth sheet 141 is disposed under the ground layer 130. A fourth coil pattern 142, a fifth via hole V5, and a sixth via hole V6 are formed in the fourth sheet 141.

The fourth coil pattern 142 is disposed on an upper surface of the fourth sheet 141, and constructs the first channel along with the first coil pattern 122 of the upper electrode layer 120. A first end 142*a* of the fourth coil pattern 142 is disposed at a center point C4 of the fourth sheet 141. The fourth coil pattern 142 is disposed on the upper surface of the fourth sheet 141, and forms a fourth loop by winding the center point C4 of the fourth sheet 141 in plural times. A second end 142*b* of the fourth coil pattern 142 is disposed on the same line as a fourth side of the fourth sheet 141.

The first end 142*a* of the fourth coil pattern 142 is connected to the first coil pattern 122 of the first sheet 121 through the first via hole V1 and the second via hole V2. Accordingly, the fourth coil pattern 142 forms the first channel along with the first coil pattern 122.

The fifth via hole V5 is disposed to be spaced apart from the center point C4 of the fourth sheet 141 at a predetermined interval. The fifth via hole V5 is connected to the second coil pattern 124 of the second sheet 123 through the third via hole V3 of the ground layer 130.

The sixth via hole V6 is disposed to be spaced apart from the center point C4 of the fourth sheet 141 at a predetermined interval. The sixth via hole V6 is disposed to face the fifth via hole V5 with the center point C3 of the fourth sheet 141 interposed therebetween. The sixth via hole V6 is connected to the third coil pattern 125 of the second sheet 123 through the fourth via hole V4.

Referring to FIG. 9, the fifth sheet 143 is disposed under the fourth sheet 141. A fifth coil pattern 144 that constructs the second channel and a sixth coil pattern 145 that constructs the third channel are formed on an upper surface of the fifth sheet 143.

The fifth coil pattern 144 is disposed on the upper surface of the fifth sheet 143, and forms a fifth loop by winding the center point C5 of the fifth sheet 143 in plural times.

A first end 144*a* of the fifth coil pattern 144 is disposed to be spaced apart from a center point C5 of the fifth sheet 143 at a predetermined interval. The first end 144*a* of the fifth coil pattern 144 is connected to the second coil pattern 124 of the second sheet 123 through the third via hole V3 and the fifth via hole V5. Accordingly, the fifth coil pattern 144 forms the second channel along with the second coil pattern 124.

A second end 144b of the fifth coil pattern 144 is disposed on the same line as a fourth side of the fifth sheet 143. In this case, the second end 144b of the fifth coil pattern 144 is disposed to neighbor a second side that is orthogonal to the fourth side of the fifth sheet 143.

The sixth coil pattern 145 is disposed on the upper surface of the fifth sheet 143, and forms a sixth loop by winding the center point C5 of the fifth sheet 143 in plural times.

A first end 145a of the sixth coil pattern 145 is disposed to be spaced apart from the center point C5 of the fifth sheet 143 at a predetermined interval. In this case, the first end 145a of the sixth coil pattern 145 is disposed to face the first end 144a of the fifth coil pattern 144 with the center point C5 of the fifth sheet 143 interposed therebetween.

A second end 145b of the sixth coil pattern 145 is disposed on the same line as the first side of the fifth sheet 143. In this case, the second end 145b of the sixth coil pattern 145 is orthogonal to a first side of the fifth sheet 143, and is disposed to neighbor a third side that faces a second side of the fifth sheet 143.

The sixth coil pattern 145 is disposed among the second loop in which the fifth coil pattern 144 has been formed. Accordingly, in a cross section of the fifth sheet 143 that has been vertically cut, the fifth coil pattern 144 and the sixth coil pattern 145 are alternately disposed.

The first end 145a of the sixth coil pattern 145 is connected to the third coil pattern 125 of the second sheet 123 through the fourth via hole V4 and the sixth via hole V6. Accordingly, the sixth coil pattern 145 forms the third channel along with the third coil pattern 125.

Meanwhile, the upper electrode layer 120, the ground layer 130, and the lower electrode layer 140 are sequentially stacked to construct a stack body.

As the upper electrode layer 120, the ground layer 130, and the lower electrode layer 140 are stacked, the stack body may be formed in the form of a hexahedron having an upper surface, a lower surface, a first lateral surface, a second lateral surface, a third lateral surface, and a fourth lateral surface.

The second ends 122b, 124b, and 125b of the first coil pattern 122 to the third coil pattern 125 are exposed to the first lateral surface of the stack body. The first end of the first pattern of the first ground pattern 132a is exposed to the second lateral surface of the stack body. The first end of the third pattern of the second ground pattern 132b is exposed to the third lateral surface of the stack body. The second ends 142b, 144b, and 145b of the fourth coil pattern 142 to the sixth coil pattern 145 are exposed to the fourth lateral surface of the stack body.

The lower protection layer 150 is disposed at the bottom of the laminated common mode filter. That is, the lower protection layer 150 is disposed under the lower electrode layer 140 and disposed at the bottom of the laminated common mode filter. In this case, the lower protection layer 150 is constructed by stacking one or more dielectric sheets.

The first external electrode 210 is disposed on a first lateral surface of the filter stack body 100. The first external electrode 210 is connected to the second end 122b of the first coil pattern 122. Both ends of the first external electrode 210 may be formed to extend to an upper surface and lower surface of the filter stack body 100.

The second external electrode 220 is disposed on the first lateral surface of the filter stack body 100. The second external electrode 220 is disposed to neighbor a second lateral surface of the filter stack body 100 and connected to the second end 124b of the second coil pattern 124. Both ends of the second external electrode 220 may be formed to extend to the upper surface and lower surface of the filter stack body 100.

The third external electrode 230 is disposed on the first lateral surface of the filter stack body 100. The third external electrode 230 is disposed to neighbor a third lateral surface of the filter stack body 100 and connected to the second end 125b of the third coil pattern 125. Both ends of the third external electrode 230 may be formed to extend to the upper surface and lower surface of the filter stack body 100.

The fourth external electrode 240 is disposed on a fourth lateral surface of the filter stack body 100. The fourth external electrode 240 is connected to the second end 142b of the fourth coil pattern 142. Both ends of the fourth external electrode 240 may be formed to extend to the upper surface and lower surface of the filter stack body 100.

The fifth external electrode 250 is disposed on the fourth lateral surface of the filter stack body 100. The fifth external electrode 250 is disposed to neighbor the second lateral surface of the filter stack body 100 and connected to the second end 144b of the fifth coil pattern 144. Both ends of the fifth external electrode 250 may be formed to extend to the upper surface and lower surface of the filter stack body 100.

The sixth external electrode 260 is disposed on the fourth lateral surface of the filter stack body 100. The sixth external electrode 260 is disposed to neighbor the third lateral surface of the filter stack body 100 and connected to the second end 145b of the sixth coil pattern 145. Both ends of the sixth external electrode 260 may be formed to extend to the upper surface and lower surface of the filter stack body 100.

The seventh external electrode 270 is disposed on the second lateral surface of the filter stack body 100. The seventh external electrode 270 is connected to the first end of the first pattern of the first ground pattern 132a. Both ends of the seventh external electrode 270 may be formed to extend to the upper surface and lower surface of the filter stack body 100.

The eighth external electrode 280 is disposed on the third lateral surface of the filter stack body 100. The eighth external electrode 280 is connected to the first end of the third pattern of the second ground pattern 132b. Both ends of the eighth external electrode 280 may be formed to extend to the upper surface and lower surface of the filter stack body 100.

The first external electrode 210 and the fourth external electrode 240 operate as an input and output of the first channel that is constructed by the first coil pattern 122 and the fourth coil pattern 142. The second external electrode 220 and the fifth external electrode 250 operate as an input and output of the second channel that is constructed by the second coil pattern 124 and the fifth coil pattern 144. The third external electrode 230 and the sixth external electrode 260 operate as an input and output of the third channel that is constructed by the third coil pattern 125 and the sixth coil pattern 145.

Referring to FIGS. 10 and 11, the first coil pattern 122 and the fourth coil pattern 142 are electrically connected through the first via hole V1 and the second via hole V2, and form a first coil corresponding to the first channel. The second coil pattern 124 and the fifth coil pattern 144 are electrically connected through the third via hole V3 and the fifth via hole V5, and form a second coil corresponding to the second channel. The third coil pattern 125 and the sixth coil pattern 145 are electrically connected through the fourth via hole V4 and the sixth via hole V6, and form a third coil corresponding to the third channel.

The first coil pattern 122 is disposed to be out of point from the second coil pattern 124 and the third coil pattern 125 in a horizontal direction (i.e., a left and right direction), and the fourth coil pattern 142 is disposed to be out of point from the fifth coil pattern 144 and the sixth coil pattern 145 in the horizontal direction (i.e., the left and right direction), on the basis of a cross section of the laminated common mode filter.

The first coil pattern 122 and the fourth coil pattern 142 are disposed to overlap each other with the ground pattern 132 interposed therebetween, the second coil pattern 124 and the fifth coil pattern 144 are disposed to overlap each other with the ground pattern 132 interposed therebetween, and the third coil pattern 125 and the sixth coil pattern 145 are disposed to overlap each other with the ground pattern 132 interposed therebetween, on the basis of the cross section of the laminated common mode filter.

Accordingly, all of D1, that is, a straight-line distance between the first coil pattern 122 and the fourth coil pattern 142, D2, that is, a straight-line distance between the second coil pattern 124 and the fifth coil pattern 144, and D3, that is, a straight-line distance between the third coil pattern 125 and the sixth coil pattern 145 are identically formed on the basis of the cross section of the laminated common mode filter.

Furthermore, all of D4, that is, a straight-line distance between the first coil pattern 122 and the second coil pattern 124, D5, that is, a straight-line distance between the first coil pattern 122 and the third coil pattern 125, and D6, that is, a straight-line distance between the second coil pattern 124 and the third coil pattern 125, are identically formed on the basis of the cross section of the laminated common mode filter.

Likewise, all of D7, that is, a straight-line distance between the fourth coil pattern 142 and the fifth coil pattern 144, D8, that is, a straight-line distance between the fourth coil pattern 142 and the sixth coil pattern 145, and D9, that is, a straight-line distance between the fifth coil pattern 144 and the sixth coil pattern 145, are identically formed. Accordingly, the straight-line distances D4 to D6 are formed identically with the straight-line distance D7 to D9.

In this case, each of the straight-line distances D1 to D9 is a straight-line distance that connects the center points of two coil patterns, and is the shortest distance between the center points of the two coil patterns, for example.

Accordingly, the laminated common mode filter according to an embodiment of the present disclosure can improve magnetic coupling (i.e., electromagnetic coupling) between the first coil to the third coil and minimize the deterioration of a differential signal.

Referring to FIG. 12, in the laminated common mode filter according to an embodiment of the present disclosure, capacitance C1 is formed between the first coil and the second coil. Capacitance C2 is formed between the second coil and the third coil.

In this case, as the ground layer 130 is interposed between the upper electrode layer 120 and the lower electrode layer 140, capacitance is additionally formed between the coil and the ground pattern 132 by a coupling effect between the coil and the ground pattern 132. That is, capacitance C3 and capacitance C4 are formed between the first coil and the ground pattern 132 by a coupling effect between the first coil and the ground pattern 132. Capacitance C5 and capacitance C6 are formed between the second coil and the ground pattern 132 by a coupling effect between the second coil and the ground pattern 132. Capacitance C7 and capacitance C8 are formed between the third coil and the ground pattern 132 by a coupling effect between the third coil and the ground pattern 132.

As described above, the laminated common mode filter according to an embodiment of the present disclosure can increase capacitance without adding an electrode layer composed of a sheet layer in which a coil pattern has been formed because the additional capacitance C3 to C8 is formed between the respective coils and the ground pattern 132.

Furthermore, the laminated common mode filter according to an embodiment of the present disclosure can expand an attenuation band by forming an additional notch in a common mode attenuation characteristic because the additional capacitance is formed between the coil and the ground pattern 132.

The above description is merely a description of the technical spirit of the present disclosure, and those skilled in the art may change and modify the present disclosure in various ways without departing from the essential characteristic of the present disclosure. Accordingly, the embodiments described in the present disclosure should not be construed as limiting the technical spirit of the present disclosure, but should be construed as describing the technical spirit of the present disclosure. The technical spirit of the present disclosure is not restricted by the embodiments. The range of protection of the present disclosure should be construed based on the following claims, and all of technical spirits within an equivalent range of the present disclosure should be construed as being included in the scope of rights of the present disclosure.

The invention claimed is:

1. A laminated common mode filter comprising:
an upper electrode layer constructed as a stack body in which a first coil pattern, a second coil pattern, and a third coil pattern have been formed;
a ground layer disposed under the upper electrode layer and having a ground pattern formed thereon; and
a lower electrode layer constructed as a stack body in which a fourth coil pattern, a fifth coil pattern, and a sixth coil pattern have been formed and disposed under the ground layer,
wherein the ground pattern is disposed to overlap the coil pattern of the upper electrode layer and the coil pattern of the lower electrode layer and configured to form capacitance, and
wherein the first coil pattern is disposed in a layer different from a layer of the second coil pattern and the third coil pattern, and the second coil pattern and the third coil pattern are alternately disposed in an identical layer on the basis of a vertical section of the upper electrode layer.

2. The laminated common mode filter of claim 1, wherein:
the fourth coil pattern is disposed in a layer different from a layer of the fifth coil pattern and the sixth coil pattern, and
the fifth coil pattern and the sixth coil pattern are alternately disposed in an identical layer on the basis of a vertical section of the lower electrode layer.

3. The laminated common mode filter of claim 2, wherein:
the first coil pattern and the fourth coil pattern are connected through a via hole and construct a first coil, and are disposed to overlap each other with the ground pattern interposed therebetween, the second coil pattern and the fifth coil pattern are connected through a via hole and construct a second coil, and are disposed to overlap each other with the ground pattern interposed therebetween, the third coil pattern and the sixth coil pattern are connected through a via hole and constructs a third coil, and are disposed to overlap each other with the ground pattern interposed therebetween, and the first coil pattern to the sixth coil pattern are configured to form additional capacitance by overlapping with the ground pattern.

4. The laminated common mode filter of claim 1, wherein:

the upper electrode layer, the ground layer, and the lower electrode layer are stacked to construct a stack body, ends of the first coil pattern, the second coil pattern, and the third coil pattern are exposed to a first lateral surface of the stack body, ends of the fourth coil pattern, the fifth coil pattern, and the sixth coil pattern are exposed to a second lateral surface of the stack body, which faces the first lateral surface of the stack body, a first end of the ground pattern is exposed to a third lateral surface of the stack body, and a second end of the ground pattern is exposed to a fourth lateral surface of the stack body, which faces the third lateral surface of the stack body.

5. The laminated common mode filter of claim 4, further comprising a plurality of external electrodes disposed on a lateral surface of the stack body and connected to one pattern, among the first coil pattern to the sixth coil pattern that are exposed to the lateral surface of the stack body and the ground pattern, in a one-to-one way.

6. A laminated common mode filter comprising:

a first sheet;

a first coil pattern disposed on a first surface of the first sheet;

a second sheet disposed on a lower surface of the first sheet;

a second coil pattern disposed on a first surface of the second sheet and interposed between the first sheet and the second sheet;

a third coil pattern disposed on the first surface of the second sheet, interposed between the first sheet and the second sheet, and spaced apart from the second coil pattern;

a third sheet disposed on a lower surface of the second sheet;

a ground pattern disposed on a first surface of the third sheet, interposed between the second sheet and the third sheet, and disposed to overlap the first coil pattern, the second coil pattern, and the third coil pattern;

a fourth sheet disposed on a lower surface of the third sheet;

a fourth coil pattern disposed on a first surface of the fourth sheet, interposed between the third sheet and the fourth sheet, configured to construct a first coil by being connected to the first coil pattern through a via hole, and disposed to overlap the first coil pattern and the ground pattern;

a fifth sheet disposed on a lower surface of the fourth sheet;

a fifth coil pattern disposed on a first surface of the fifth sheet, interposed between the fourth sheet and the fifth sheet, configured to construct a second coil by being connected to the second coil pattern through a via hole, and disposed to overlap the second coil pattern and the ground pattern; and a sixth coil pattern disposed to be spaced apart from the fifth coil pattern on the first surface of the fifth sheet, interposed between the fourth sheet and the fifth sheet, configured to construct a third coil by being connected to the third coil pattern through a via hole, and disposed to overlap the third coil pattern and the ground pattern.

7. The laminated common mode filter of claim 6, wherein:

the second coil pattern and the second coil pattern are alternately disposed on the basis of a vertical section of the second sheet, and the fifth coil pattern and the sixth coil pattern are alternately disposed on the basis of a vertical section of the fifth sheet.

8. The laminated common mode filter of claim 6, wherein the ground pattern comprises:

a first ground pattern disposed to overlap some of the first coil pattern to the sixth coil pattern and configured to form additional capacitance; and a second ground pattern spaced apart from the first ground pattern, disposed to overlap other some of the first coil pattern to the sixth coil pattern, and configured to form additional capacitance.

9. The laminated common mode filter of claim 6, wherein:

ends of the first coil pattern, the second coil pattern, and the third coil pattern are exposed to a first lateral surface of a stack body in which the first sheet to the fifth sheet have been stacked, and ends of the fourth coil pattern, the fifth coil pattern, and the sixth coil pattern are exposed to a second lateral surface of the stack body, which faces the first lateral surface of the stack body.

10. The laminated common mode filter of claim 9, further comprising:

a first external electrode disposed on the first lateral surface of the stack body and connected to the first coil pattern;

a second external electrode disposed on the first lateral surface of the stack body and connected to the second coil pattern;

a third external electrode disposed on the first lateral surface of the stack body and connected to the third coil pattern;

a fourth external electrode disposed on the second lateral surface of the stack body and connected to the fourth coil pattern;

a fifth external electrode disposed on the second lateral surface of the stack body and connected to the fifth coil pattern; and a sixth external electrode disposed on the second lateral surface of the stack body and connected to the sixth coil pattern.

11. The laminated common mode filter of claim 10, wherein:

a first end of a ground pattern of a ground layer is exposed to a third lateral surface of the stack body, and a second end of the ground pattern is exposed to a fourth lateral surface of the stack body, which faces the third lateral surface of the stack body.

12. The laminated common mode filter of claim 11, further comprising:

a seventh external electrode disposed on a third lateral surface of the stack body and connected to the first end of the ground pattern; and an eighth external electrode disposed on a fourth lateral surface of the stack body and connected to the second end of the ground pattern.

* * * * *